United States Patent
Ra

[11] Patent Number: 5,879,978
[45] Date of Patent: Mar. 9, 1999

[54] SEMICONDUCTOR DEVICE AND METHOD OF FABRICATING THE SAME

[75] Inventor: Myeong-Man Ra, Chungcheongbuk-do, Rep. of Korea

[73] Assignee: LG Semicon Co.,Ltd., Chungcheongbuk-Do, Rep. of Korea

[21] Appl. No.: 903,148

[22] Filed: Jul. 30, 1997

[30] Foreign Application Priority Data

Jul. 31, 1996 [KR] Rep. of Korea ................. 1996/31645

[51] Int. Cl.⁶ ................................................. H01L 21/336
[52] U.S. Cl. ........................... 438/197; 438/260; 438/964
[58] Field of Search .................................. 438/260, 964, 438/197

[56] References Cited

U.S. PATENT DOCUMENTS 5,504,022  4/1996  Nakanishi et al. ..................... 438/260
5,658,381  8/1997  Thakur et al. ......................... 438/964

OTHER PUBLICATIONS

C. Hu, et al., Hot–Electron–Induced MOSFET Degradation–Model, Monitor, and Improvement, IEEE Transactions on Electron Devices, vol. ED–32, No. 2, Feb. 1985, pp. 375–385.

*Primary Examiner*—John F. Niebling
*Assistant Examiner*—Lynne A. Gurley
*Attorney, Agent, or Firm*—Morgan, Lewis & Bockius LLP

[57] ABSTRACT

A method of making a semiconductor device includes forming a semiconductor substrate having an undulated surface, a gate insulating layer on the semiconductor substrate, a gate electrode on the gate insulating layer, and a source/drain impurity diffusion region in the substrate. The method of fabricating the semiconductor device includes the steps of forming an undulated surface on the substrate by using HSG (hemispherical grain), forming a gate insulating layer on the substrate, forming a gate electrode on the gate insulating layer, and forming an impurity region in the substrate.

12 Claims, 5 Drawing Sheets

SEMICONDUCTOR DEVICE AND METHOD OF FABRICATING THE SAME

This application claims the benefit of Korean Application Number 31645/1996 filed on Jul. 31, 1996, which is hereby incorporated by reference.

BACKGROUND OF THE INVENTION

1. Field of the Invention

The present invention relates to a semiconductor device and, more particularly, to a semiconductor device and a method of fabricating the same. Although the present invention is suitable for a wide scope of applications, it is particularly suitable for reducing a short channel effect in highly integrated semiconductor devices.

2. Discussion of the Related Art

As semiconductor devices are becoming more highly integrated, they are downsized to achieve sub-micron level semiconductor devices. As a result, the problem of short channel effect in transistor has arisen, caused by hot carrier or punch through phenomenon as the distance between the source and drain regions becomes shorter.

According to the article by Chemning Hu et. al, "Hot Electron-induced MOSFET Degradation Model, Monitor and Improvement", IEEE Transactions on Electron Devices, Vol. ED32. No. 2, 1985, pp. 375–385, instability of the transistor due to the hot carrier is generated by a short channel and a very high electric field around a drain junction caused by applying a high voltage. Therefore, a lightly doped drain (LDD) structure is suggested to improve a conventional transistor device having the problems of hot carrier and short channel.

With reference to the attached drawings, a conventional semiconductor device and method of fabricating the same will be described as follows.

The conventional semiconductor device, as illustrated in FIG. 1, includes a semiconductor substrate having an active region and a field region, a gate insulating layer 12 on the active region, a gate electrode 15 on the gate insulating layer 12, a sidewall spacer 17 on both sides of the gate electrode 15, and an impurity diffusion region is having an LDD structure in the semiconductor substrate 11 below each of the sidewall spacers 17.

A method of fabricating the conventional semiconductor device is illustrated in FIGS. 2A to 2D. Referring to FIG. 2A, the gate insulating layer 12 and a polycrystal silicon layer 13 for the gate electrode are successively formed on the semiconductor substrate 11. After a photoresist layer 14 is deposited on the polycrystal silicon layer 13, the photoresist layer 14 is patterned by an exposing and developing process.

As illustrated in FIG. 2B, the polycrystal silicon layer 13 and the gate insulating layer 12 are selectively removed by using a patterned photoresist layer 14 as a mask, thereby forming the gate electrode 15. After the patterned photoresist layer 14 is removed from the gate electrode 15, impurity ions are implanted lightly by using the gate electrode 15 as a mask to form a lightly doped impurity region 16.

In FIG. 2C, an insulating layer (not shown) for the sidewall spacer 17 is deposited on the overall surface of the substrate and an etch-back process is performed to form the sidewall spacer 17 on both sides of the gate electrode 15 and the gate insulating layer 12.

FIG. 2D illustrates impurity ions are implanted heavily on the overall surface of the substrate by using the sidewall spacer 17 and the gate electrode 15 as masks, so that the impurity diffusion region 18 having the LDD structure are formed below each of the sidewall spacers 17.

However, the aforementioned conventional semiconductor device has a problem as follows. Since the semiconductor substrate is planar and the gate electrode is formed thereon, a channel length cannot be long enough to prevent a short channel effect. In other words, the degree of transistor integration is limited. In order to increase the channel length, the size of a MOS transistor must also be increased in the conventional device.

SUMMARY OF THE INVENTION

Accordingly, the present invention is directed to a semiconductor device and a method of fabricating the same that substantially obviates one or more of the above problems.

An object of the present invention is to provide a semiconductor device and a method of fabricating the same having a gate electrode formed on an undulated semiconductor substrate, so that a channel length per unit area is increased, thereby enhancing the integration and characteristics of the semiconductor device.

Additional features and advantages of the present invention will be set forth in the description which follows, and in part will be apparent from the description, or may be learned by practice of the present invention. The objectives and other advantages of the present invention will be realized and attained by the structure particularly pointed out in a written description and claims hereof as well as the appended drawings.

To achieve these and other advantages and in accordance with the purpose of the present invention, as embodied and broadly described, the semiconductor device includes a semiconductor substrate of which surface is undulated, a gate insulating layer and a gate electrode on a predetermined portion of the semiconductor substrate a plurality of sidewall spacers formed on both sides of the gate insulating layer and the gate electrode; source and drain impurity diffusion region formed in the semiconductor substrate below the purity of sidewall spacers.

In another aspect, the method of fabricating the semiconductor devices includes the steps of forming a semiconductor substrate of which surface is undulated forming the gate insulating layer and the gate electrode on a predetermined portion of the substrate, and forming an impurity region in the semiconductor substrate below each side of the gate electrode.

In another aspect, the semiconductor device includes a semiconductor device includes a semiconductor substrate having an undulated surface, a gate insulating layer on the semiconductor substrate, a gate electrode on the gate insulating layer, and source/drain impurity diffusion regions below each side of the gate electrode in the substrate.

In another aspect, the method of fabricating the semiconductor device having a substrate includes the steps of forming an undulated surface on the substrate, forming a gate insulating layer and a gate electrode on the substrate sequentially, and forming a plurality of impurity regions in the substrate below each side of the gate electrode.

In another aspect, the method of fabricating the semiconductor device having a substrate includes the steps of forming a hemispherical grain (HSG) substrate, forming an undulated surface of the substrate undulated, forming a gate insulating layer on the undulated surface of the substrate, forming a polysilicon on the gate insulating layer, forming a gate electrode by patterning the polysilicon and gate insulating layer, implanting first impurity ions on the overall surface of the substrate by using the gate electrode as a mask, forming a first and second sidewall spacers on first and second sides of the gate electrode and gate insulating layer, and implanting second impurity ions on the overall surface of the substrate by using the gate electrode and the first and second sidewall spacers as masks.

In a further aspect, the method of fabricating a semiconductor device having a substrate includes the steps of forming a hemispherical grain (HSG) on the substrate, forming an undulated surface of the substrate by etching the HSG and the substrate, forming a gate insulating layer on the undulated surface of the substrate, forming a polysilicon layer on the gate insulating layer, and forming a gate electrode by patterning the polysilicon layer and the gate insulating layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the present invention and are incorporated in and constitute a part of this specification, illustrate embodiments of the present invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
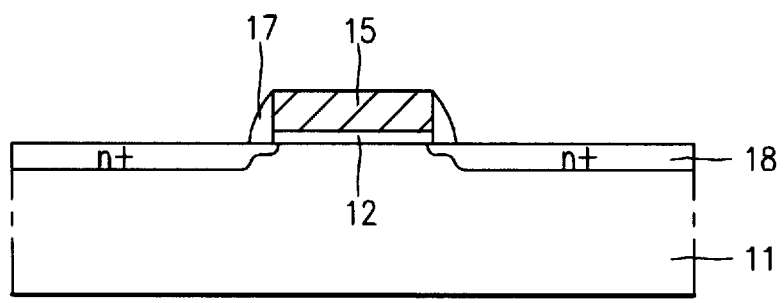
FIG. 1 is a cross-sectional view of a conventional semiconductor device.
Figure 2A:
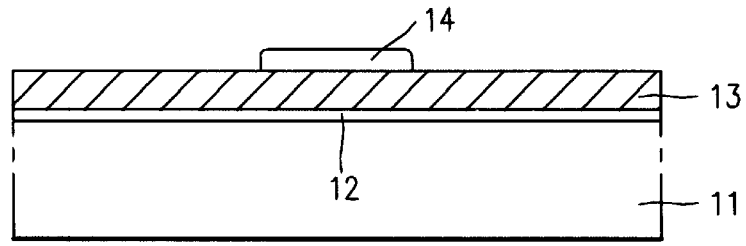
FIGS. 2A through 2D are cross-sectional views illustrating the process steps of fabricating the conventional semiconductor device.
Figure 2B:
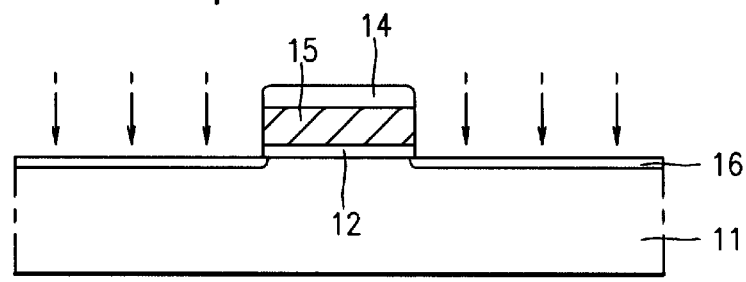
Figure 2C:
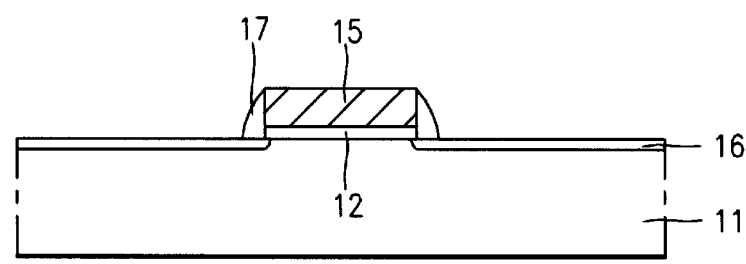
Figure 2D:
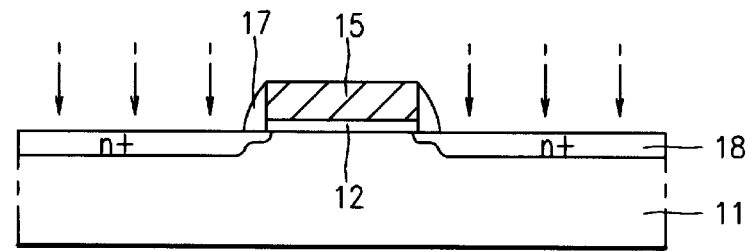
Figure 3:
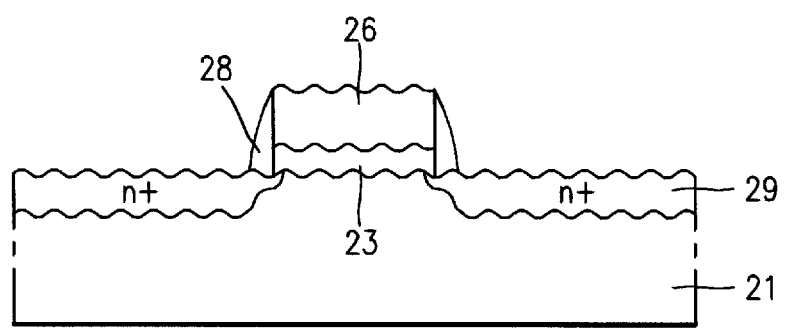
FIG. 3 is a cross-sectional view of a semiconductor device in accordance with a preferred embodiment of the present invention.

Referring to FIG. 3, a semiconductor device of the present invention includes a semiconductor substrate 21 having an undulated surface, a gate insulating layer 23 and a gate electrode 26 on a predetermined portion of the undulated surface of the semiconductor substrate 21, sidewall spacers 28 on both sides of the gate electrode 26, and source/drain impurity diffusion regions 29 having an LDD structure below each of the sidewall spacers 28 and the gate electrode 26 in the semiconductor substrate 21.

Figure 4A:
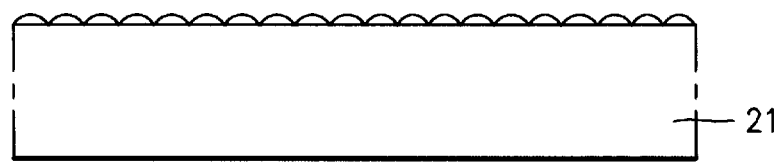
FIGS. 4A through 4E are cross-sectional views illustrating the process steps of fabricating the semiconductor device in accordance with the preferred embodiment of the present invention.

FIGS. 4A to 4E are cross-sectional views of the present invention in the process steps of fabricating the semiconductor device. As illustrated in FIG. 4A, a hemispherical grain (HSG) 22 is formed on the overall surface of the semiconductor substrate 21, and the HSG 22 and the overall surface of semiconductor substrate 21 are dry-etched to have a predetermined height. Here, the HSG 22 is formed by growing p-type silicon at a temperature lower than 580° C. and annealing it for 10 through 40 minutes at a temperature range of 500° to 700° C.

Figure 4B:
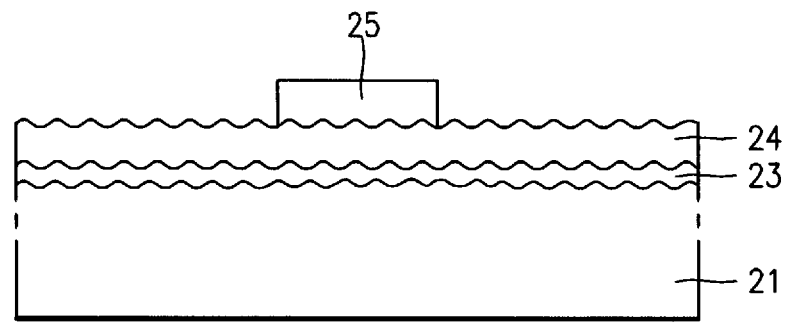

In FIG. 4B, an over-etching process is performed to partially remove the HSG 22 and the substrate 21 by dry-etching and the gate insulating layer 23. For example, an oxide layer may be used for the gate insulating layer 23. Thereafter, a polysilicon layer 24 for a gate electrode are successively formed on the semiconductor substrate 21 having an undulated surface due to the dry-etching process. In this process, a height of the HSG 22 and the substrate after dry-etching is greater than a thickness of the HSG formed on the substrate 21 in FIG. 4A. A photoresist 25 is deposited on the polysilicon layer 24, and patterned by an exposing and developing process.

Figure 4C:
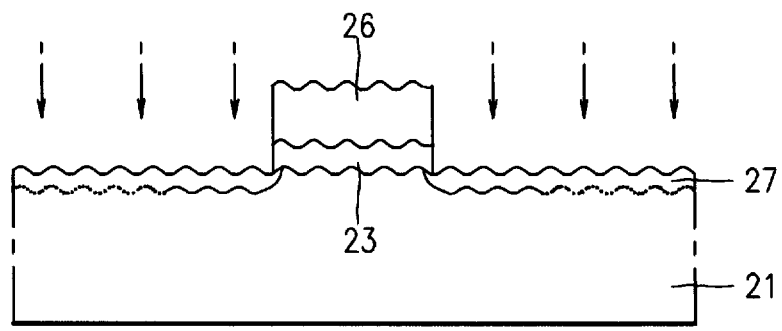

As illustrated in FIG. 4C, the polysilicon layer 24 and the gate insulating layer 23 are selectively removed by using a patterned photoresist layer 25 as a mask, thereby forming the gate electrode 26. After the photoresist layer 25 is removed, impurity ions are implanted lightly using the gate electrode 26 as a mask, so that the lightly doped impurity diffusion region 27 is formed on the semiconductor substrate 21.

Figure 4D:
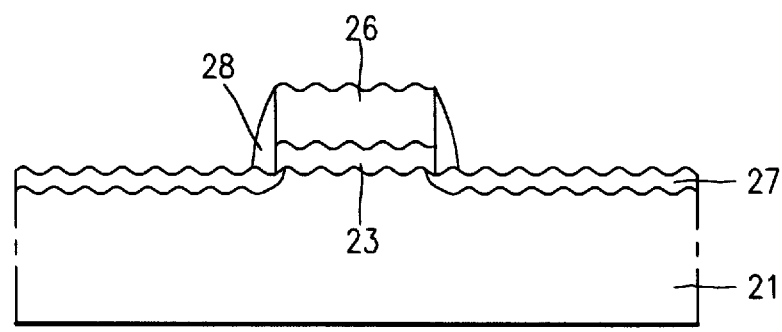

Thereafter, an insulating layer for sidewall spacers is deposited on the overall surface of the substrate 21 including the gate electrode 26, and sidewall spacers 28 are formed by removing the insulating layer except on both sides of the gate electrode 26 and insulating layer 23 by an etch-back process as shown in FIG. 4D.

Figure 4E:
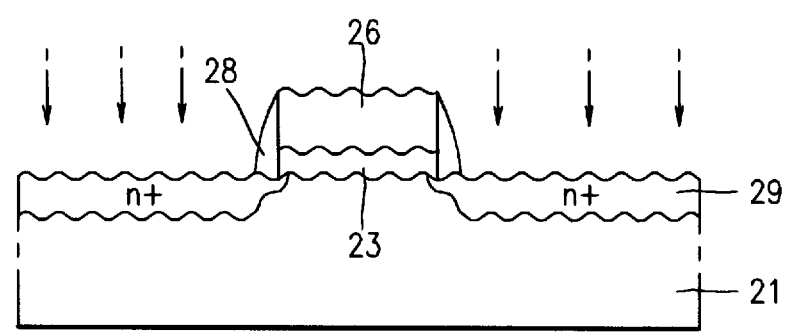

Impurity ions are then heavily implanted on the overall surface of the substrate 21 by using the sidewall spacer 28 and the gate electrode 27 as a mask as shown in FIG. 4E. Accordingly, the source/drain impurity diffusion regions having the LDD structure are formed in the semiconductor substrate 21

As described above, the present invention has the following advantages over the conventional semiconductor devices.

Channel length is much increased to prevent a short channel effect, thereby enhancing reliability. Packing density is also increased due to downsizing the device. Further, since the substrate has an undulated surface, a contact area of the substrate is much increased in fabricating a storage node or bit line, thereby decreasing resistance.

It will be apparent to those skilled in the art that various modifications and variations can be made in the semiconductor device and the method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device having a substrate, comprising the steps of:
   forming a hemispherical grain (HSG) on the substrate having a first height;
   dry-etching the HSG and the substrate to have a second height, thus forming an undulated surface on the substrate;
   forming a gate insulating layer on the substrate;
   forming a gate electrode on the gate insulating layer; and
   forming an impurity region in the substrate.

2. The method according to claim 1, wherein the second height of the HSG and the substrate after the step of dry-etching the HSG and the substrate is greater than the first height of the HSG on the substrate in the step of forming a hemispherical grain (HSG).

3. The method according to claim 1, wherein the step of forming a hemispherical grain (HSG) includes the steps of:

growing a silicon layer on the substrate at a temperature lower than about 580° C.; and annealing the silicon layer for 10–40 minutes at a temperature range of 500°–700° C.

4. A method of fabricating a semiconductor device having a substrate, comprising the steps of:

forming a hemispherical grain (HSG) on the substrate;

forming an undulated surface on the substrate by dry-etching the HSG and the substrate;

forming a gate insulating layer on the undulated surface of the substrate;

forming a gate electrode on the gate insulating layer;

implanting first impurity ions on the overall surface of the substrate by using the gate electrode as a mask;

forming first and second sidewall spacers on first and second sides of the gate electrode and gate insulating layer; and implanting second impurity ions on the overall surface of the substrate by using the gate electrode on the first and second sidewall spacers as masks.

5. The method according to claim 4, wherein the HSG is formed by growing a silicon layer on the substrate at a temperature lower than 580° C., and annealing the silicon layer for 10–40 minutes at a temperature of 500°–700° C.

6. The method according to claim 4, wherein the step of forming a gate electrode includes the steps of:

forming a polysilicon layer on the gate insulating layer; and patterning the polysilicon layer.

7. The method according to claim 4, wherein the gate insulating layer includes oxide.

8. The method according to claim 4, wherein the second impurity ions have a concentration higher than the first impurity ions.

9. A method of fabricating a semiconductor device having a substrate, comprising the steps of:

forming a hemispherical grain (HSG) on the substrate;

forming an undulated surface on the substrate by over-etching the HSG and the substrate;

forming a gate insulating layer on the undulated surface of the substrate;

forming a polysilicon layer on the gate insulating layer; and forming a gate electrode by patterning the polysilicon layer and the gate insulating layer.

10. The method as claimed in claim 9, wherein the gate insulating layer includes oxide.

11. The method according to claim 9, wherein the step of forming a hemispherical grain (HSG) includes the steps of:

growing a silicon layer on the substrate at a temperature lower than 580° C.; and annealing the silicon layer for 10–40 minutes at a temperature range of 500°–700° C.

12. The method according to claim 9, wherein the over-etching of the HSG and the substrate is executed by a dry-etching process.

* * * * *